US012313682B2

(12) United States Patent
Biswas et al.

(10) Patent No.: US 12,313,682 B2
(45) Date of Patent: May 27, 2025

(54) METHOD, SYSTEM AND DEVICE OF SERIALIZING AND DE-SERIALIZING THE DELIVERY OF SCAN TEST DATA THROUGH CHIP I/O TO REDUCE THE SCAN TEST DURATION OF AN INTEGRATED CIRCUIT

(71) Applicants: Sounil Biswas, San Jose, CA (US); Amit Wangoo, Cupertino, CA (US); Zhanwei Zhong, Milpitas, CA (US)

(72) Inventors: Sounil Biswas, San Jose, CA (US); Amit Wangoo, Cupertino, CA (US); Zhanwei Zhong, Milpitas, CA (US)

(73) Assignee: MARVELL ASIA PTE, LTD., Singapore (SG)

( * ) Notice: Subject to any disclaimer, the term of this patent is extended or adjusted under 35 U.S.C. 154(b) by 505 days.

(21) Appl. No.: 17/869,495

(22) Filed: Jul. 20, 2022

(65) Prior Publication Data
US 2024/0027526 A1 Jan. 25, 2024

(51) Int. Cl.
*G01R 31/3187* (2006.01)
*G06F 13/42* (2006.01)

(52) U.S. Cl.
CPC ..... *G01R 31/3187* (2013.01); *G06F 13/4282* (2013.01)

(58) Field of Classification Search
CPC ........ G01R 31/3187; G01R 31/318572; G01R 31/31922; G01R 31/319; G01R 31/3177; G01R 31/31713; G01R 31/31715; G01R 31/318511; G06F 13/4282; G11C 29/022
USPC .............. 73/865.9; 324/537, 750.05, 762.01, 324/762.02, 762.06; 375/224; 438/14; 702/58, 108, 117, 118, 125, 120, 127; 703/14; 714/724, 742
See application file for complete search history.

(56) References Cited

U.S. PATENT DOCUMENTS

| 6,876,704 | B2 * | 4/2005 | LaRocca ............... | G06F 17/147 375/240.2 |
|---|---|---|---|---|
| 11,181,579 | B2 * | 11/2021 | Tokuz ................. | G06F 11/2236 |
| 2002/0145441 | A1 * | 10/2002 | Shiraishi ............ | G01R 31/3185 324/756.07 |
| 2021/0116503 | A1 * | 4/2021 | Tokuz ................. | G06F 11/2236 |

FOREIGN PATENT DOCUMENTS

CN 113906393 A * 1/2022 ......... G01R 31/3177

* cited by examiner

*Primary Examiner* — Jeffrey P Aiello (57) ABSTRACT

An integrated circuit verification system including automatic test equipment (ATE) and a device under test (DUT) having an internal test data de-serializer and test response data serializer. Specifically, the de-serializer of the DUT is able to de-serialize a test pattern or scan test data generated and received from an ATE at a general-purpose I/O pin (or functional pin) of the DUT for testing a circuit under test (CUT) of the DUT and then serialize the response to the test data with the serializer for output back to the ATE via the same or a different general-purpose I/O pin (or functional pin) of the DUT.

30 Claims, 7 Drawing Sheets

METHOD, SYSTEM AND DEVICE OF SERIALIZING AND DE-SERIALIZING THE DELIVERY OF SCAN TEST DATA THROUGH CHIP I/O TO REDUCE THE SCAN TEST DURATION OF AN INTEGRATED CIRCUIT

RELATED APPLICATIONS

This application claims priority under 35 U.S.C. § 119(e) of the co-pending U.S. provisional patent application Ser. No. 63/349,726, filed Jun. 7, 2022, and titled "NOVEL TECHNIQUE OF SERIALIZING AND DE-SERIALIZING THE DELIVERY OF SCAN TEST DATA THROUGH CHIP I/O TO REDUCE THE SCAN TEST DURATION OF AN INTEGRATED CIRCUIT," which is hereby incorporated by reference.

FIELD OF INVENTION

The present invention relates to integrated circuit verification. More particularly, the present invention relates to scan test data delivery to and response retrieval from a device under test.

BACKGROUND OF THE INVENTION

Over the last two decades, semiconductor technology has accelerated at tremendous pace. Moore's law states that semiconductor technology complexity will double every 18 months to 2 years—and industry has kept pace quite diligently to this prediction. As a result, the number of gates (and, in turn, the number of transistors) per monolithic integrated circuit (IC) has grown exponentially as well. Relatively however, the test time budget for these ICs has not been allowed to grow in any significant fashion. In fact, the requirement has been to instead reduce test time for overall IC cost purposes. In addition, the cost of testing ICs per minute has remained more or less constant over the last two decades. This, in turn, has generated enormous pressure to maintain or even lower the test time budget for ICs while their complexity continued to grow.

Some researchers have also recognized this issue and have proposed various solutions. The commonly used solution is scan compression. Specifically, by using scan compression, one can compress the test vectors required to test an IC, and thereby reduce the overall payload on automatic test equipment (ATE) to achieve target scan test coverage. This is the most widely use solution across the industry. However, over the last half a decade to a decade, IC sizes have grown so significantly that this solution alone has no longer been sufficient to keep test time and cost under the desired budget.

Subsequently, researchers have ventured to find additional solutions to supplement scan compression to further reduce test time. First off, researchers have proposed sequential compression as opposed to combinatorial compression to further reduce scan pattern payload size. This has also been widely deployed across the industry. However, again this solution has become insufficient over the last half a decade on very large modern ICs, and more is required to address the rising test cost of these very large ICs.

Recognizing the shortcoming of the above existing and widely used solutions, a few researchers have proposed the use of non-generic or specialized I/O interfaces such as the standard high-speed universal serial bus (USB) I/O interface or peripheral component interface express (PCIe) I/O interface for delivering the scan pattern payload to the ICs as well as retrieving the response from the ICs. These interfaces support very high-speed operation and can indeed provide significant reduction in overall test time. However, the interfaces require protocol specific packetization of the test data which the standard ATE equipment often does not support. Moreover, significant additional hardware is required within the IC to convert typical scan pattern payload from externally delivered high-speed packets (as required to use those interfaces) to a standard format and the reverse for the scan responses. These issues have limited the adoption of this solution.

Another solution has been the introduction of IEEE 1149.10 standard. However, this standard also re-uses the same high-speed I/Os interfaces of an IC (e.g., USB or SERDES I/Os) and thus suffers similar drawbacks. Specifically, instead of using the functional interfaces of these I/Os, the standard introduces a specialized packet format and hardware to interface between the external ATE and internal scan logic. Since the IEEE1149.10 standard still uses the high-speed I/O interfaces of an IC, there is still the limitation of the standard ATE not supporting interface with these I/O interfaces. In addition, the test logic is completely limited to the availability of these I/Os in an IC.

BRIEF SUMMARY OF THE INVENTION

An integrated circuit verification system including automatic test equipment (ATE) and a device under test (DUT) having an internal test data de-serializer and test response data serializer. Specifically, the de-serializer of the DUT is able to de-serialize a test pattern or scan test data generated and received from an ATE at a general-purpose I/O pin/port (or other functional pins available for test) of the DUT for testing a circuit under test (CUT) of the DUT and then serialize the response to the test data with the serializer for output back to the ATE via the same or a different general-purpose I/O pin/port (or other functional pins available for test) of the DUT.

A first aspect is directed to an integrated circuit verification system. The system comprises of an electronic device under test comprising of one or more general-purpose input/output (I/O) ports, a scan serializer including a serializer and a de-serializer, wherein an input of the de-serializer is coupled with the general-purpose I/O ports for serially receiving scan test data and an output of the serializer is coupled with the general-purpose I/O ports for serially outputting test response data and one or more circuits under test having a plurality of virtual I/O ports, wherein an output of the de-serializer is coupled with the virtual I/O ports for transmitting de-serialized scan test data to the circuits under test and an input of the serializer is coupled with the plurality of virtual I/O ports for non-serially inputting the test response data from the circuits under test and automatic test equipment having a memory and a processor and coupled with the device under test via the one or more general-purpose I/O ports, wherein the automatic test equipment is configured to generate the scan test for testing the device under test, serially transmit the scan test to the device under test via the one or more general-purpose I/O ports, serially receive the serial test response data via the one or more general-purpose I/O ports and analyze the serial test response data by comparing the serial test response data to expected response data stored on the memory.

A second aspect is directed to an electronic device under test for operating with automatic test equipment. The electronic device under test comprises one or more general-purpose input/output (I/O) ports for receiving scan test data serially transmitted from the automatic test equipment, a scan serializer including a serializer and a de-serializer, wherein an input of the de-serializer is coupled with the general-purpose I/O ports for serially receiving the scan test data and an output of the serializer is coupled with the general-purpose I/O ports for serially outputting test response data to the automatic test equipment and one or more circuits under test having a plurality of virtual I/O ports, wherein an output of the de-serializer is coupled with the virtual I/O ports for transmitting de-serialized scan test data to the circuits under test and an input of the serializer is coupled with the plurality of virtual I/O ports for non-serially inputting the test response data from the circuits under test.

In some embodiments in the first and/or second aspects, the general-purpose I/O ports do not require the serial scan test data to be formatted according to a packet protocol format. In some embodiments in the first and/or second aspects, the scan serializer is a digital scan serializer such that the serializer is a digital serializer and the de-serializer is a digital de-serializer. In some embodiments in the first and/or second aspects, the scan test data as serially transmitted by the automatic test equipment is not formatted into packets. In some embodiments, the de-serializer comprises a plurality of shift registers each having a number of registers corresponding to a de-serialization ratio of the de-serializer. In some embodiments in the first and/or second aspects, the de-serializer inputs the serial scan test data according to a serial clock, holds the serial scan test data static within the shift registers for at least a half cycle of the scan clock, and outputs the de-serialized scan test data according to a scan clock, wherein the scan clock is slower than the serial clock. In some embodiments in the first and/or second aspects, negative edges of the scan clock and negative edges of the serial clock are aligned. In some embodiments in the first and/or second aspects, the scan serializer further comprises a bypass component. In some embodiments in the first and/or second aspects, the virtual I/O ports are inputs to flip-flops of the circuits under test. In some embodiments in the first and/or second aspects, the expected response data is based on the scan test data.

A third aspect is directed to a method of operating an integrated circuit verification system. The method comprises of serially transmitting scan test data with automatic test equipment to one or more general-purpose input/output (I/O) ports of an electronic device under test, the electronic device under test including a scan serializer including a serializer and a de-serializer, serially inputting the scan test data from the general-purpose I/O ports with the de-serializer, de-serializing the scan test data into de-serialized scan test data, and outputting the de-serialized scan test data to a plurality of virtual I/O ports of one or more circuits under test, non-serially receiving test response data from the virtual I/O ports of the circuits under test with the serializer, serializing the test response data into serialized test response data, and outputting the serialized test response data to the automatic test equipment via the general-purpose I/O ports and serially receiving and analyzing the serialized test response data with the automatic test equipment by comparing the serialized test response data to expected response data.

In some embodiments in the third aspect, the general-purpose I/O ports do not require the serial scan test data to be formatted according to a packet protocol format. In some embodiments in the third aspect, the scan serializer is a digital scan serializer such that the serializer is a digital serializer and the de-serializer is a digital de-serializer. In some embodiments in the third aspect, the scan test data as serially transmitted by the automatic test equipment is not formatted into packets. In some embodiments in the third aspect, the de-serializer comprises a plurality of shift registers each having a number of registers corresponding to a de-serialization ratio of the de-serializer. In some embodiments in the third aspect, the de-serializer serially inputs the scan test data according to a serial clock, the method further comprising holding the scan test data static within the shift registers for at least a half cycle of the scan clock, and outputting the de-serialized scan test data according to a scan clock, wherein the scan clock is slower than the serial clock. In some embodiments in the third aspect, negative edges of the scan clock and negative edges of the serial clock are aligned. In some embodiments in the third aspect, the scan serializer further comprises a bypass component. In some embodiments in the third aspect, the virtual I/O ports are inputs to flip-flops of the circuits under test. In some embodiments in the third aspect, the expected response data is based on the scan test data.

DETAILED DESCRIPTION OF THE INVENTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein.

Embodiments are directed to an integrated circuit verification system including automatic test equipment (ATE) and a device under test (DUT) having an internal test data de-serializer and test response data serializer. Specifically, the de-serializer of the DUT is able to de-serialize a (e.g. non-packetized) test pattern or scan test data generated and received from an ATE at a general-purpose I/O pin (or functional pin) of the DUT for testing a circuit under test (CUT) of the DUT and then serialize the response to the test data with the serializer for output back to the ATE via the same or a different general-purpose I/O pin (or functional pin) of the DUT. As a result, the integrated circuit verification system provides the advantage of reducing IC test time (and thereby test cost) by enabling serialization of data transfer between the ATE and the DUT without requiring the use of specialized I/O (e.g. USB, PCIE, SERDES pins) and thus without requiring the packetization of the data that is associated with the specialized I/O pins.

In other words, the scan test data does not need to adhere to or be transmitted in a packet protocol format required by the specialized I/O (e.g. divided into a plurality of packets each having a header with one or more fields (e.g. destination address) and a payload (if it is a data packet)). For example, use of a PCIE pin would require packetizing the scan data into PCIE protocol-specific packets (with packet beginning, header, payload, and packet end). As a result, this packetized scan test data cannot be continuously transmitted and also would require the ATE to continuously create these test data packets (from the original scan test data), require the DUT to convert the response data into the data packets, as well as require that the ATE deconvolute the received packets of response data for pass/fail comparison. In contrast, in the integrated circuit verification system described herein there is no test data packetization required so the ATE can continuously send data in and receive data for pass/fail comparison without any data packetization and/or de-packetization.

Further, because the system only needs to be stored on the DUT itself and does not require use of specialized I/O pins/ports/interfaces (and their associated protocols), the system provides the advantage of being ATE platform agnostic such that it can be used with any ATE without modification thereof. In contrast, in systems that are stored on the ATE itself and/or require packetization and/or the use of specialized I/O interfaces, the ATE would require modification to handle the data packets it would receive while doing the protocol-based testing. For example, a PCIE interface would require the ATE to be modified to handle PCIE packets (e.g. packet construction/de-construction). Moreover, ATE would also need to be modified to run at high speeds (e.g., 8 GHz, 16 GHz etc. in case of PCIE protocol) to take full advantage of the speed improvement achieved from these interfaces, which are far higher than what is supported by typical ATE (that range in 200-800 MHz).

Figure 1:
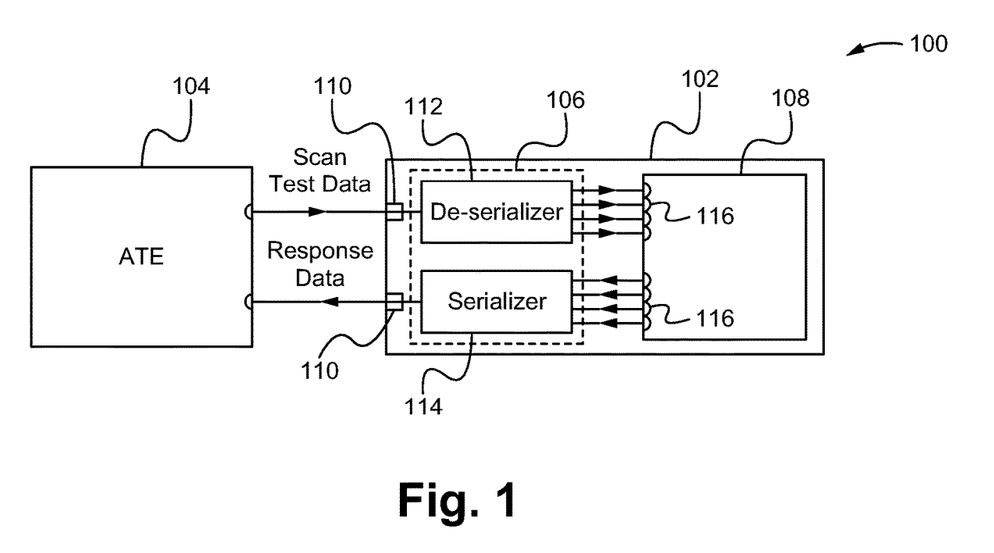
FIG. 1 illustrates an integrated circuit verification system according to some embodiments.

FIG. 1 illustrates an integrated circuit verification system 100 according to some embodiments. As shown in FIG. 1, the integrated circuit verification system 100 comprises a DUT 102 wired and/or wirelessly operably coupled with ATE 104 via one or more general-purpose I/O pins/ports (or functional pins/ports) 110 of the DUT 102. The ATE 104 is able to comprise one or a combination of testing equipment able to generate (or access from its memory) and serially transmit one or more (e.g. non-packetized) test patterns and/or scan test data sets (for testing a CUT 108 of the DUT 102). Further, the ATE 104 is able to serially receive responses to the test data and then compare the captured test response with the expected response data that is also stored in its ATE memory.

The DUT 102 is able to be an electronic device (e.g. infrastructure semiconductor device) including one or more integrated circuits. Specifically, the DUT 102 is able to comprise a scan serializer 106 (including a de-serializer 112 and a serializer 114), one or more CUTs 108 and one or more general-purpose I/O pins/ports (or functional pins/ports) 110. Both the serializer 114 and the de-serializer 114 are coupled to the CUT 108 via one or more virtual pins 116 (e.g. flip flops/scan cells) for transmitting de-serialized scan test data to and receiving non-serial test response data from the CUT 108. Similarly, both the serializer 114 and the de-serializer 114 are coupled with the ATE 104 via the general-purpose I/O pins 110 for receiving serial scan test data from and transmitting serial test response data to the ATE 104 via the pins 110. In contrast, to universal serial bus (USB) ports, peripheral component interconnect express (PCIe) ports and other similar ports/pins, the general-purpose I/O pins/ports 110 are able to handle both incoming and outgoing data (e.g. digital or analog signals) without requiring the input and/or output data to be in a packetized format. For example, the general-purpose I/O pins/ports 110 are able to be serial communication ports (e.g. RS-232, RS-422, RS-485) and/or pins thereof. In some embodiments, the general-purpose I/O pins/ports 110 are able to be pins/ports that do not require data input and/or output of the pins/ports to be in a protocol format utilizing packets (e.g. header, body/payload, etc.) such as the protocols required for USB, PCIe and other types of ports/pins. Alternatively, the general-purpose I/O pins/ports 110 are able to be pins/ports that do not require data input and/or output of the pins/ports to be in any specified protocol format (e.g. pins/ports that have no input/output data format requirements).

The scan serializer 106 is able to be implemented entirely by digital components (rather than the traditional analog SERDES design). Alternatively, the scan serializer 106 is able to be implemented with analog components. Further, the scan serializer 106 is able to be implemented via software, hardware or a combination of software and hardware (with the software stored in a memory of the DUT 102 and executed by the processor of the DUT 102). Indeed, because it is able to be implemented entirely with digital components, the scan serializer 106 provides the benefit of being able to be a much simpler design as compared to a traditional analog functional serializer/de-serializer (SERDES) thereby minimizing cost of the DUT 102.

Although as shown in FIG. 1, the DUT 102 comprises two pins 110, a single scan serializer 106 and a single CUT 108 having eight virtual pins 116, the DUT 102 is able to have more or less pins 110, a plurality of scan serializers 106 and/or a plurality of CUTs 108 each having any number of virtual pins 116. In particular, the DUT 102 is able to have a separate scan serializer 106 for each CUT 108 or for a subset of the total number of CUTs 108 on the DUT 102 such that the separate scan serializer 106 is able to handle the serialization and de-serialization for that CUT 108 or CUT 108 subset. In such embodiments, the DUT 102 is able to have one or more pins 110 that correspond to one or more particular scan serializers 106 and/or one or more particular CUTs 108 (or subsets thereof). The CUTs 108 are able to be the entirety or a sub-portion of any kind of electronic circuit including, but not limited to, microchips, top of rack switches, software defined network microchips and/or other types of integrated circuits (and/or combinations thereof).

In operation, the ATE 104 generates, or accesses from memory, scan test data for a target CUT 108 on the DUT 102 and serially transmits the scan test data to the DUT 102 via one or more of the general-purpose I/O pins 110. The scan serializer 106 inputs the serial scan test data from the pins 110 and de-serializes the scan test data with the de-serializer 112 thereby producing de-serialized scan test data. The scan serializer 106 then outputs the de-serialized scan test data in parallel to the target CUT 108 where it is captured via a plurality of the virtual pins 116 of the CUT 108 (e.g. with the CUT 108 and/or virtual pins 116 in test mode). This de-serialization of the scan test data is able to step down the frequency of the scan test data signal from a higher serialized clock frequency to a lower scan clock frequency (e.g. where the serialized clock is 4 to 8 or more times faster than the scan clock).

After the scan test data is loaded into CUT 108, the CUT 108 and/or virtual pins 116 are put back into functional mode and the test response data is captured in one or more cycles. The CUT 108 and/or virtual pins 116 are again put in test mode and the CUT 108 non-serially outputs the captured test response data to the scan serializer 106 via a plurality of the virtual pins 116. This outputting is able to occur concurrently with the loading of a subsequent set of scan test data such that the testing is able to occur continuously. The scan serializer 106 inputs the non-serial response data from the virtual pins 116 and serializes the response data with the serializer 114 thereby producing serialized response data. The scan serializer 106 then serially outputs the serialized response data back to the ATE 104 via one or more of the general-purpose I/O pins 110. This serialization of the response data is able to step up the frequency of the response data signal from the lower scan clock frequency back up to the higher serialized clock frequency. Subsequently, the ATE 104 compares the captured response data with the expected response data that is stored in its memory and any result deviations are likely defects and are logged for further evaluation.

Figure 2:
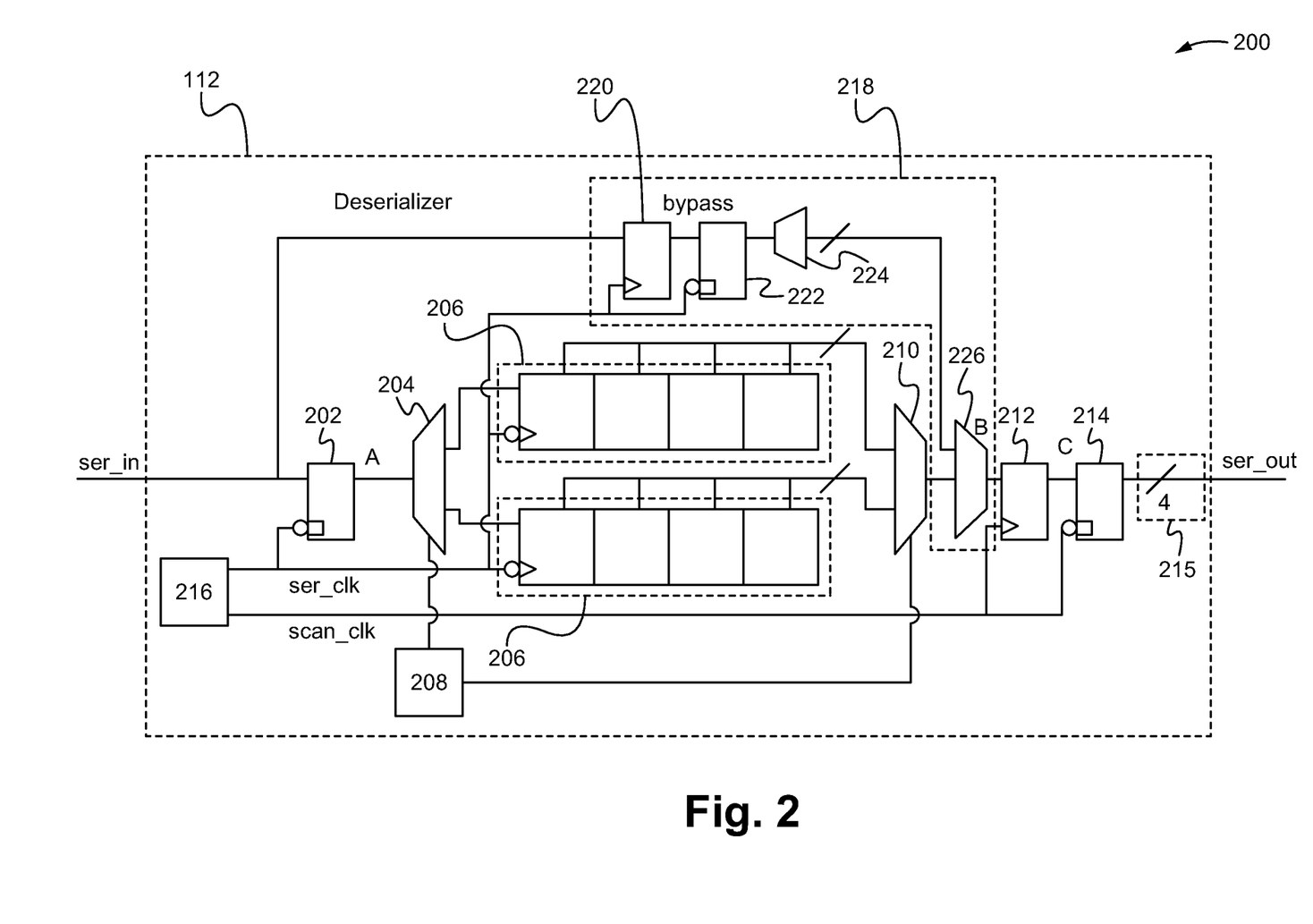
FIG. 2 illustrates a gate-level view of the de-serializer according to some embodiments.

FIG. 2 illustrates a gate-level view of the de-serializer 112 according to some embodiments. As shown in FIG. 2, the de-serializer 112 comprises an input negative edge sensitive latch 202, an input demultiplexer 204, one or more shift registers 206, a controller 208 (e.g. state machine), an output multiplexor 210, an output positive edge sensitive flip-flop element 212, an output negative edge sensitive latch element 214, an output data bus 215 and one or more clock generators 216. In some embodiments, the controller 208 comprises a modulo-4 state machine that is clocked by the negative-edge of the serial clock (ser_clk). Alternatively, the controller 208 is able to include other types of digital controlling components.

The output positive edge sensitive flip-flop element 212 and the output negative edge sensitive latch element 214 are able to comprise one or more output positive edge sensitive flip-flops and one or more output negative edge latches, respectively, with the total number of flip-flops and the total number of latches corresponding to the de-serialization ratio of the de-serializer 112. Therefore, because FIG. 2 is illustrating an exemplary 1:4 de-serialization ratio, the output positive edge sensitive flip-flop element 212 is able to comprise four output positive edge sensitive flip-flops coupled in parallel to the output and/or bypass multiplexers 210, 226 and the output negative edge sensitive latch element 214 is able to comprise four output negative edge sensitive latches each coupled to a different one of the four output positive edge sensitive flip-flops. These pairs of flip-flops and latches each operate in the same manner (as described below) but with a separate unit (e.g. bit) of the output data set per cycle such that they together output the entire output data set in parallel on the data bus 215 at the appropriate clock cycle as also described below. For the sake of clarity, FIG. 2 and the operation discussion below discuss and illustrate the operation of a single one of the flip-flop latch pairs, which can be applied to any other of the pairs. Similarly, although only a single output ser_out is shown in FIG. 2, it is understood that the bus 215 outputs one or more output signals in parallel corresponding to the de-serialization ratio and/or number of flip-flip latch pairs.

The clock generators 216 are able to generate a faster clock signal (serial clock or ser_clk) and a slower clock signal (scan clock or scan_clk), wherein the ratio of the serial clock frequency (and/or period) to the scan clock frequency (and/or period) corresponds to the ratio of serialization and de-serialization performed by the scan serializer 106. For example, if the scan serializer 106 is de-serializing the input serial scan test data into 4 scan test data outputs (i.e. 4:1 ratio), then the faster clock signal will have a frequency (and/or period) that is 4 times faster than that of the slower clock frequency (and/or period). In some embodiments, the serial clock has a frequency of 200 MHz to 400 MHz (e.g. the maximum supported frequency of the general I/P pins 110). Alternatively, the serial clock is able to have a higher or lower frequency. As shown in FIG. 2, the input negative edge sensitive latch 202 and the one or more shift registers 206 operate based on the faster serial clock signal and the output positive edge sensitive flip-flop 212 and the output negative edge sensitive latch 214 operate based on the slower scan clock signal.

In operation, a scan test data signal (ser_in) is input by the latch 202. This negative level-sensitive latch 202 ensures that any skew or delay in the signal is corrected and the scan test data is passed through to the input multiplexer 204 at the negative edge of the ser_clk. Next, the input multiplexer 204 selects one of the plurality of shift registers 206 also running on ser_clk based on signals from the controller 208 (wherein the controller 208 causes the multiplexer 204 to toggle/switch to a different one of the shift registers 206 whenever a currently selected shift register 206 is full (e.g. after four serial clock cycles) as described below). The selected 206 register fills up with (e.g. four) units of the scan test data in a number of serial clock cycles (e.g. four cycles for a four shift register 206 made up of four registers). Once the selected shift register 206 is full (such that all registers contain valid data), the control signal from the controller 208 causes the multiplexer 204 to select the other shift register 206 and to continue shifting in units of the scan test data from ser_in seamlessly.

Meanwhile, the scan test data in the previously selected shift register 206 remains static. While this scan test data is the previously selected shift register 206 is static, a downstream network of muxes (e.g. the output multiplexer 210 and/or the bypass multiplexer 226) selects this full/previously selected shift register 206 (based on the control signals from the controller 208). Specifically, the controller 208 causes the downstream network of multiplexers 210, 226 to toggle/switch to another of the shift registers 206 (e.g. the previously selected shift register 206 with static data) whenever a currently selected shift register 206 has been fully sampled (e.g. after four serial clock cycles) as described below and the another of the shift registers is full of static data. The de-serializer 112 then samples all (e.g. four) registers of the full/previously selected shift register 206 using the positive-edge output flip-flop 212 running on scan_clk to create a set of scan test data (4-bit or other unit) for output on the output data bus 215. In particular, because the scan_clk is running at quarter the speed of ser_clk, there will only be a single scan_clk pulse during the four ser_clk pulses loading the newly selected shift register 206. In some embodiments, the positive-edge flip flop 212 running on scan_clk is followed by a negative level-sensitive latch 214 to launch the sets of data out of the de-serializer 112 via the bus 215 at the port(s) ser_out on the negative edge of scan_clk. In particular, because ser_clk and scan_clk are negative edge aligned, this whole process of sampling one shift register 206 into the slower scan_clk domain while loading the other shift register 206 using the faster ser_clk is able to occur seamlessly.

The use of the plurality of shift registers 206 provides the benefit of enabling the system 100 to ensure that clock domain crossings between ser_clk and scan_clk are always half cycle on scan_clk and/or a 2-cycle multi-cycle path on ser_clk. Specifically, the additional shift registers 206 beyond the first shift register 206 act as buffers to enable the test data to be held stable for 2 cycles of ser_clk and half cycle of scan_clk before and after the positive edge of the scan_clk. Alternatively, only a single shift register 206 is able to be used.

Figure 3:
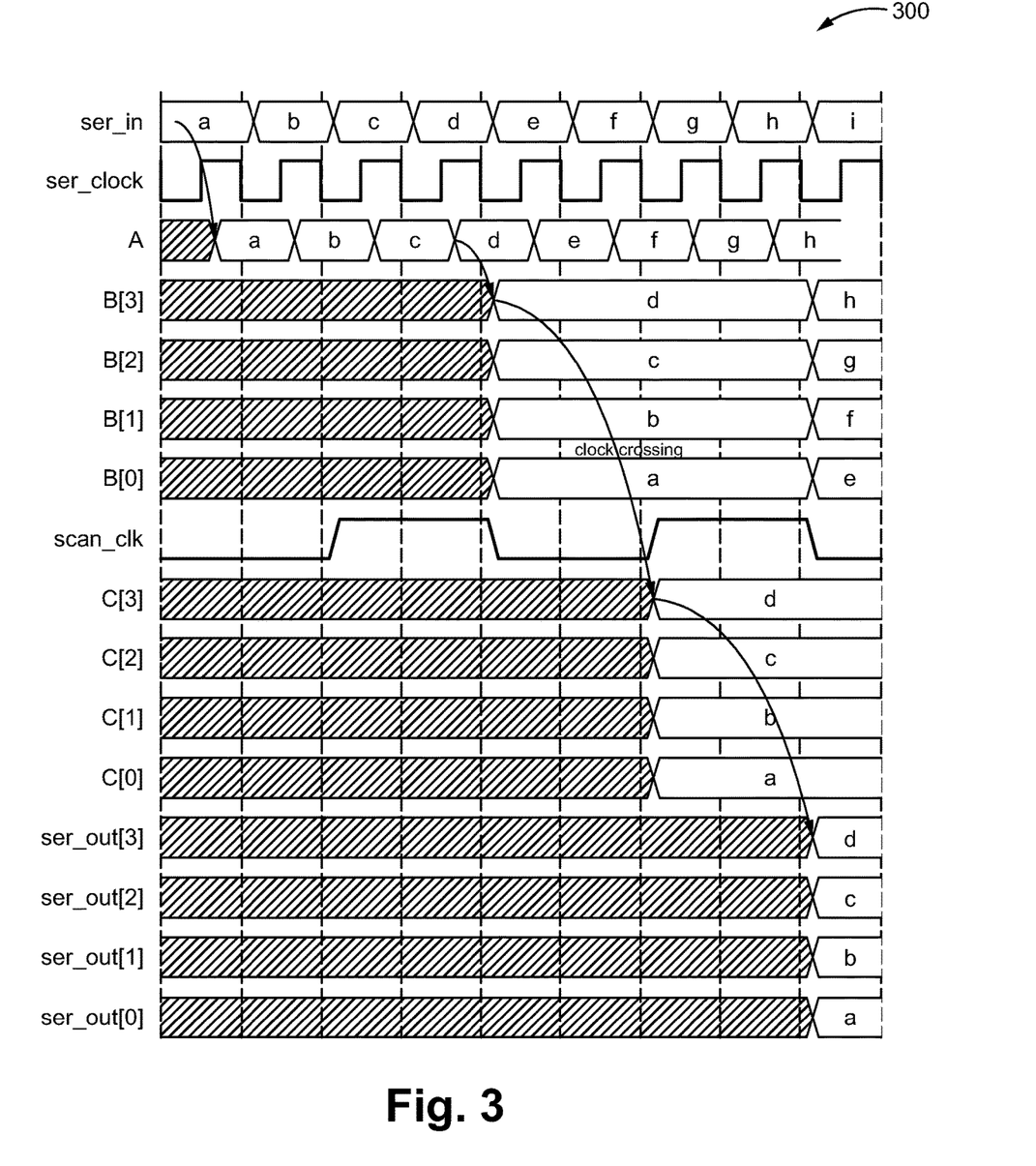
FIG. 3 illustrates a timing diagram showing a timing of the path of exemplary scan test data into, through points A, B and C, and out of the de-serializer of FIG. 2 according to some embodiments.

FIG. 3 illustrates a timing diagram 300 showing a timing of the path of exemplary scan test data into, through points A, B and C, and out of the de-serializer 112 of FIG. 2 according to some embodiments. Specifically, as shown in FIG. 3, the timing is arranged in manner such that there is half a cycle of scan_clk in either direction where the data will be static. This provides the benefit of protecting against potential hold timing violations that otherwise may have occurred when data crosses from high-speed ser_clk domain to low-speed scan_clk domain (see clock crossing from point B to point C).

In some embodiments, the paths between ser_clk and scan_clk are timed synchronously. This provides the benefit of enabling the data transfer between the two clock domains to be seamless and continuous for the pattern generation tools and ATE equipment 104 to work without any modification. In some embodiments, ser_clk and scan_clk are aligned at their negative edges. This negative edge alignment helps with the continuous data transfer between the two clock domains. Further, in some embodiments the input pads transition on the negative edge of ser_clk while output pads are observed on the positive edge of ser_clk. This enables the system 100 to operate with the traditional scan test patterns used on ATE equipment 104. Also, in some embodiments the paths to pads (e.g. circuit pads) are always half-cycle paths, wherein inputs are captured within the DUT 102 on positive edges of the ser_clk while outputs are launched from the DUT 102 on negative edges of the ser_clk. Alternatively, as described herein, the polarity of the clocks and/or component sensitivities are able to be switched (as long as their sensitivity relative to each other remains unchanged). Thus, in such a switch for example, the clocks would be aligned at their positive edges, inputs would be captured within the DUT 102 on negative edges of the ser_clk while outputs are launched from the DUT 102 on positive edges of the ser_clk, etc.

In some embodiments, the de-serializer 112 further comprises a bypass component 218 including an output positive edge sensitive bypass flip-flop 220, an output negative edge sensitive bypass latch 222, a bypass demultiplexer 224 and a bypass multiplexer 226. As shown in FIG. 2, the output positive edge sensitive bypass flip-flop 220 and the output negative edge sensitive bypass latch 222 operate based on the serial clock. Additionally, although not shown for the sake of clarity, the bypass demultiplexer 224 and a bypass multiplexer 226 are able to be controlled by control signals from the controller 208. In operation, the bypass component 218 enables the de-serializer 112 to be switched to a bypass mode via control signals from the controller 208, wherein the input serial scan test data uses the bypass component 218 to bypass the de-serialization process and instead be serially output from the de-serializer. In other words, in bypass mode, the de-serializer 112 works by sharing the I/Os among N sets of de-serializer blocks (where N:1 is the serialization/de-serialization ratio). In contrast, in normal serialization mode, the N de-serializer blocks are time multiplexed and able to be tested in parallel at higher chip I/O speeds. Alternatively, the bypass component 218 is able to be omitted from the de-serializer 112.

Figure 4:
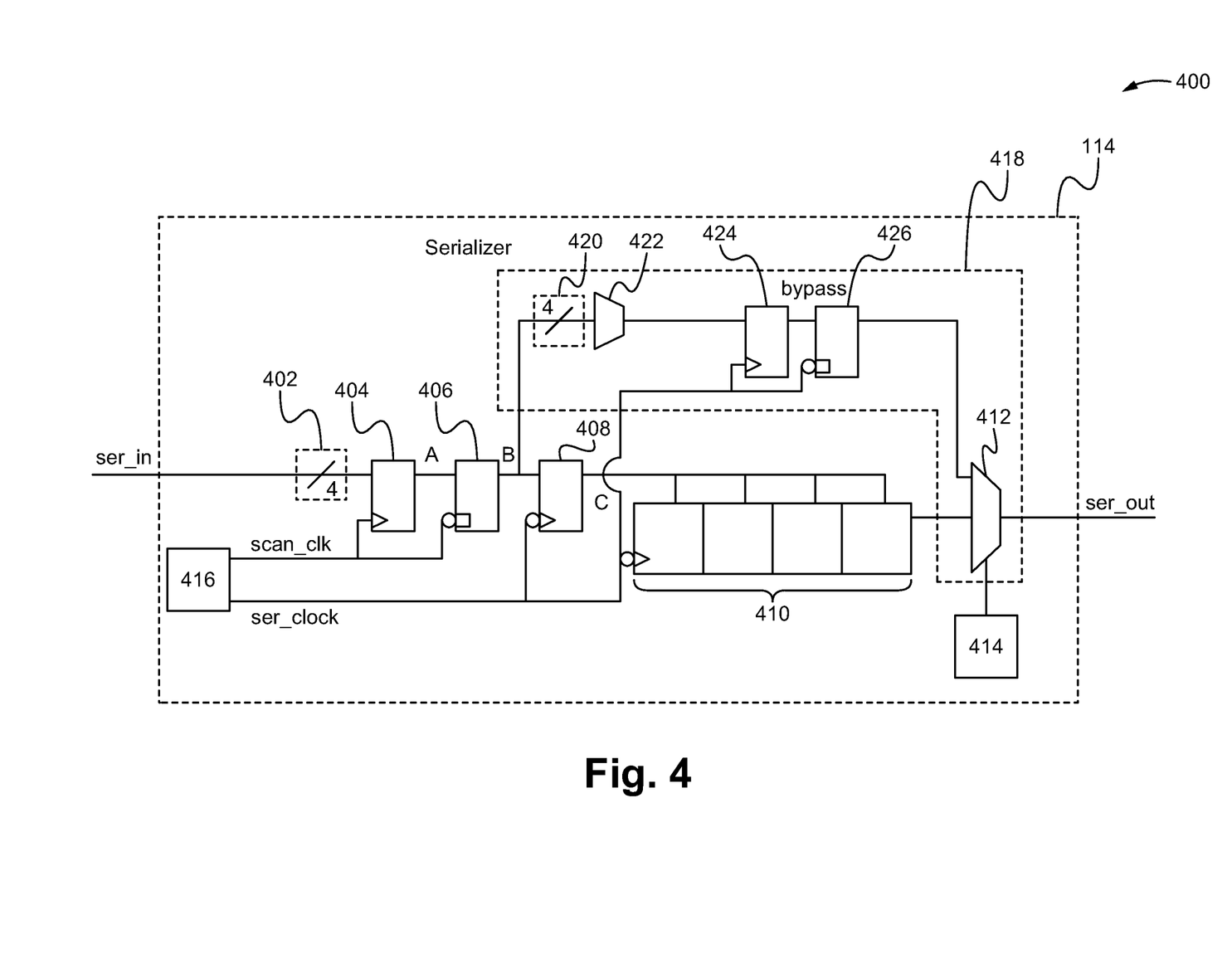
FIG. 4 illustrates a gate-level view of the serializer according to some embodiments.

FIG. 4 illustrates a gate-level view of the serializer 114 according to some embodiments. As shown in FIG. 4, the serializer 114 comprises an input data bus 402 (e.g. 4 bit data bus inputting 4 bits of data in parallel), a positive edge sensitive flip-flop element 404, a negative edge sensitive latch element 406, a negative edge sensitive flip-flop element 408, one or more shift registers 410, a bypass component 418, a controller 414 (e.g. state machine) and one or more clock generators 416. Alternatively, as described below, the bypass component 418 is able to be omitted. In some embodiments, the controller 414 is the same controller 208 shown in FIG. 2 and/or comprises a modulo-4 state machine that is clocked by the negative-edge of the serial clock (ser_clk). Alternatively, the controller 414 is able to include other types of digital controlling components.

Similar to the output positive edge sensitive flip-flop element 212 and the output negative edge sensitive latch element 214 described above, the positive edge sensitive flip-flop element 404, the negative edge sensitive latch element 406 and the negative edge sensitive flip-flop element 408 are able to comprise one or more positive edge sensitive flip-flops, one or more negative edge latches, and one or more negative edge sensitive flip-flops, respectively, with the total number of positive edge flip-flops, the total number of latches and the total number of negative edge flip-flops corresponding to the serialization ratio of the serializer 114. Therefore, because FIG. 4 is illustrating an exemplary 4:1 serialization ratio, the positive edge sensitive flip-flop element 404 is able to comprise four positive edge sensitive flip-flops each coupled to one of the parallel ser_in response data input lines of the data bus 402. Further, the negative edge sensitive latch element 406 is able to comprise four negative edge sensitive latches each coupled to a different one of the four positive edge sensitive flip-flops and the negative edge sensitive flip-flop element 408 is able to comprise four negative edge sensitive flip-flops each coupled to a different one of the four negative edge sensitive latches. These 3-tuples of a positive edge flip-flop, a negative edge latch and a negative edge flip-flop each operate in the same manner (as described below) but with a separate unit (e.g. bit) of the parallel input data set (ser_in input by the bus 402) per cycle such that they together input the entire input data set in parallel to the register 410 at the appropriate clock cycle as also described below. For the sake of clarity, FIG. 4 and the operation discussion below discuss/illustrate the operation of a single one of the flip-flop/latch/flip-flop tuples, which can be applied to any other of the tuples. Similarly, although only a single input ser_out is shown in FIG. 4, it is understood that the bus 402 inputs a plurality of input signals in parallel corresponding to the serialization ratio and/or number of tuples.

The clock generators 416 are able to be the same clock generators 216 shown in FIG. 2 and/or are able to generate a faster clock signal (serial clock or ser_clk) and a slower clock signal (scan clock or scan_clk), wherein the ratio of the serial clock frequency (and/or period) to the scan clock frequency (and/or period) corresponds to the ratio of serialization and de-serialization performed by the scan serializer 106. For example, if the scan serializer 106 is de-serializing the input serial scan test data into 4 scan test data outputs (i.e. 4:1 ratio), then the faster clock signal will have a frequency (and/or period) that is 4 times faster than that of the slower clock frequency (and/or period). In some embodiments, the serial clock has a frequency of 200 MHz to 400 MHz (e.g. the maximum supported frequency of the general I/P pins 110). Alternatively, the serial clock is able to have a higher or lower frequency. As shown in FIG. 4, the positive edge sensitive flip-flop element 404 and the negative edge sensitive latch element 406 operate based on the slower scan clock signal and the negative edge sensitive flip-flop element 408 and the one or more shift registers 410 operate based on the faster serial clock signal.

In operation, the input data bus 204 provides one of the response data signals (ser_in) received in parallel from the CUT 108 to the positive edge sensitive flip-flop 424, which samples a unit (e.g. bit) of the response data based on the scan_clk (point A). The sampled response data is subsequently passed through the negative edge sensitive latch 406 based on the scan_clk as well to make sure data unit is delivered to the faster ser_clk domain at a negative edge (point B). Next, the response data unit is sampled using the negative edge sensitive flip-flop 408 running on ser_clk to transfer the data unit to the high-speed domain (point C). Finally, a register of the shift register 410 operating on the negative edge of ser_clk is used to sample the data unit such that the shift register 410 subsequently shifts the data unit along the register 410 and out of the serializer 114 via the ser_out port. For example, each register of the shift register 410 is able to sample the data unit from a different flip-flop 408 of the tuples described above, with the input response data unit (e.g. 4 bits) being passed along the registers and/or serially shifted out of the shift register 410 based on the ser_clk to produce the serial response data output signal. Indeed, because the frequency ratio of the scan clock to the serial clock correspond to the number of tuples of flip-flop/latch/flip-flop and the number of registers of the shift register 410, the shift register 410 is able to sample and shift out each set of response data units provided by the tuples slower scan clock frequency before sampling a new set of response data units provided at the next cycle of the scan clock.

Figure 5:
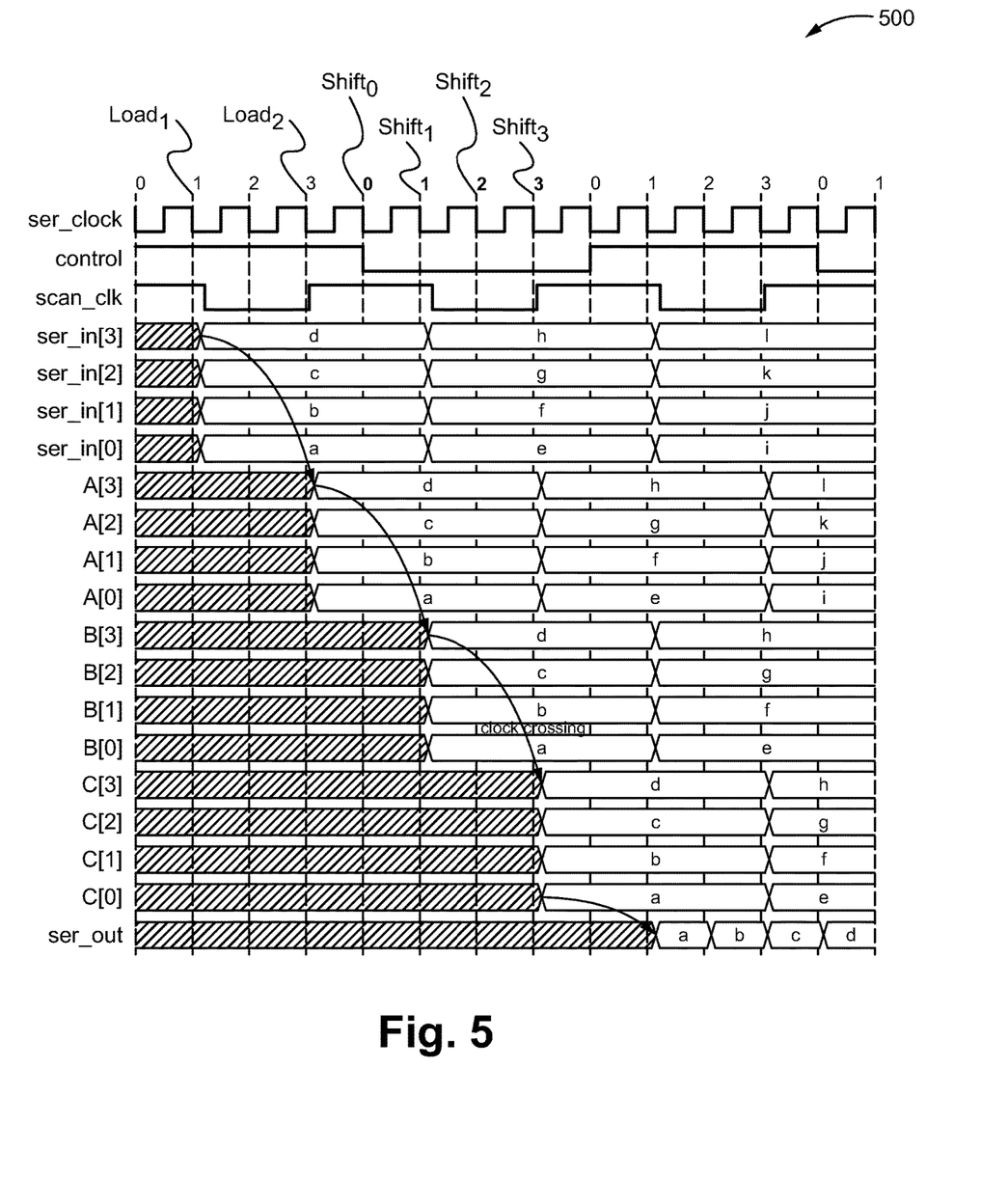
FIG. 5 illustrates a timing diagram showing a timing of the path of exemplary test response data into, through points A, B and C, and out of the serializer of FIG. 4 according to some embodiments.

FIG. 5 illustrates a timing diagram 500 showing a timing of the path of exemplary test response data into, through points A, B and C, and out of the serializer 114 of FIG. 4 according to some embodiments. Specifically, as shown in FIG. 5, the internal response data shifts from the input of the serializer ser_in and becomes available at an internal point B on the negative edge of the scan clock (scan_clk). The data is then transferred from point B to C inside the serializer 114 using the negative edges of ser_clk between cycle 1 and cycle 2. Finally, the data is overwritten (load 2) at the subsequent negative edges of ser_clk, namely cycle 3 and cycle 0. Meanwhile, the data available at point C is also loaded into the shift register 420 at the negative edge of ser_clk. The data within the shift register 410 is then shifted out through ser_out port (e.g. based on signals from the controller 414).

In some embodiments, the serializer 114 further comprises a bypass component 418 including a bypass bus 420, a bypass input multiplexer 422, a positive edge sensitive bypass flip-flop element 424, a negative edge sensitive bypass latch element 426 and a bypass output multiplexer 412. As shown in FIG. 4, the positive edge sensitive bypass flip-flop element 424 and the negative edge sensitive bypass latch element 426 operate based on the serial clock. Additionally, although not shown for the sake of clarity, in addition to controlling the bypass output multiplexer 412, the controller 414 controls the bypass input multiplexer 422 via control signals. In operation, the bypass component 418 enables the serializer 114 to be switched to a bypass mode via control signals from the controller 414, wherein the input parallel test response data uses the bypass component 418 to bypass the serialization process and instead be non-serially output from the serializer 114. Alternatively, the bypass component 418 is able to be omitted from the serializer 114.

Figure 6:
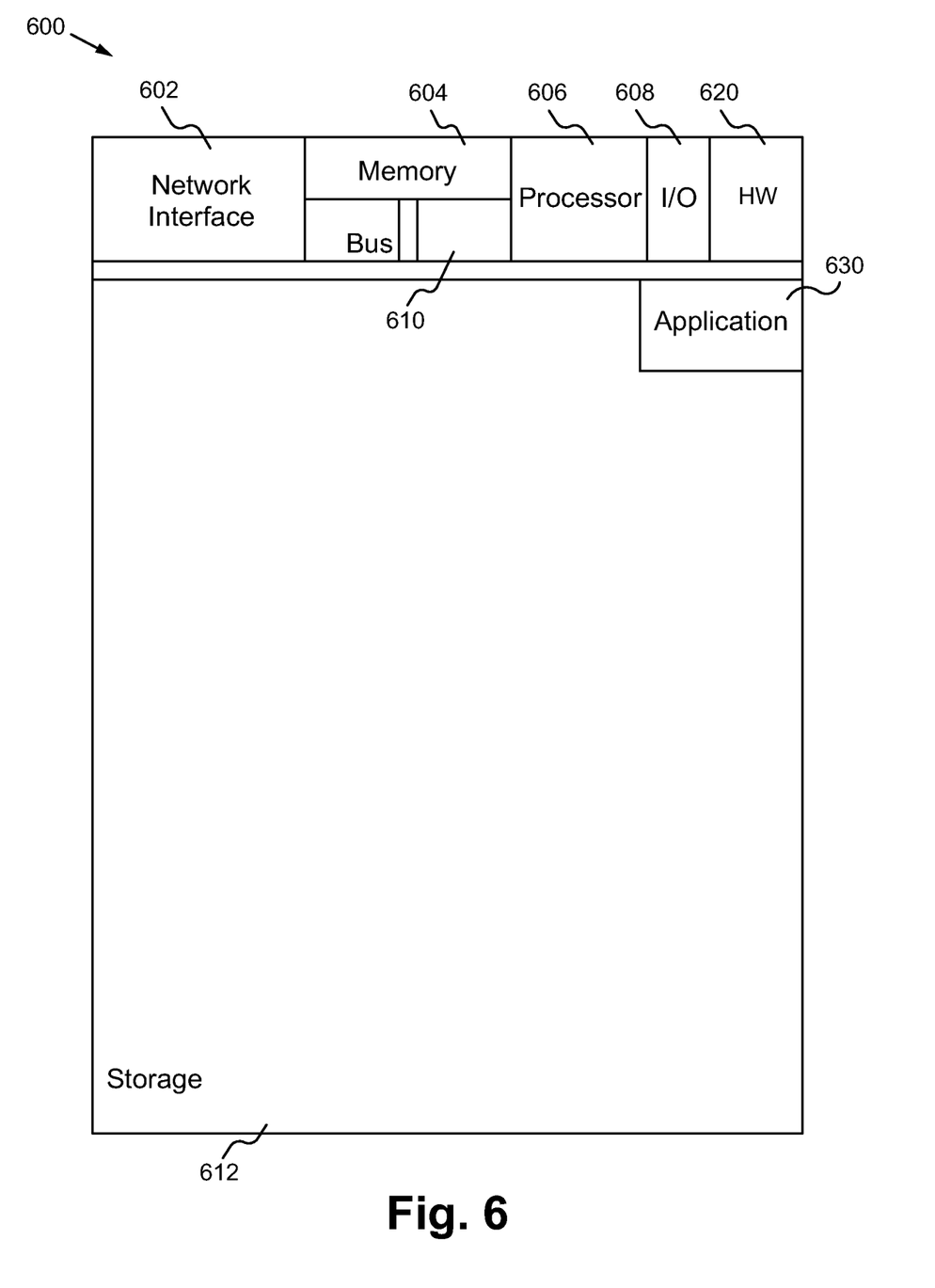
FIG. 6 illustrates a block diagram of an exemplary computing device according to some embodiments.

FIG. 6 illustrates a block diagram of an exemplary computing device 600 according to some embodiments. The computing device 600 is able to be one or more of the ATE 104, the DUT 102 and/or any of the other electronic devices described herein. In general, a hardware structure suitable for implementing the computing device 600 includes one or more of a network interface 602, a memory 604, a processor 606, I/O device(s) 608, a bus 610 and a storage device 612. Alternatively, one or more of the illustrated components are able to be removed or substituted for other components well known in the art. The memory 604 is able to be any conventional computer memory known in the art. The storage device 612 is able to include a hard drive, RAM, SRAM, CDROM, CDRW, DVD, DVDRW, flash memory card or any other storage device. The computing device 600 is able to include one or more network interfaces 602. An example of a network interface includes a network card connected to an Ethernet or other type of LAN. The I/O device(s) 608 are able to include one or more of the following: keyboard, mouse, monitor, display, printer, modem, touchscreen, button interface and other devices. The operating system(s), graphical user interface(s), application(s), module(s) and/or other software 630 used to operate the device 600 are likely to be stored in the memory 604 and/or storage device 612 and processed as applications are typically processed via the processor 606.

More or less components shown in FIG. 6 are able to be included in the computing device 400. In some embodiments, hardware 620 is included. Although the computing device 600 in FIG. 6 includes software 630 and hardware 620, the features/functions of the device 600 are able to be implemented on the computing device 600 in hardware, firmware, software or any combination thereof.

Figure 7:
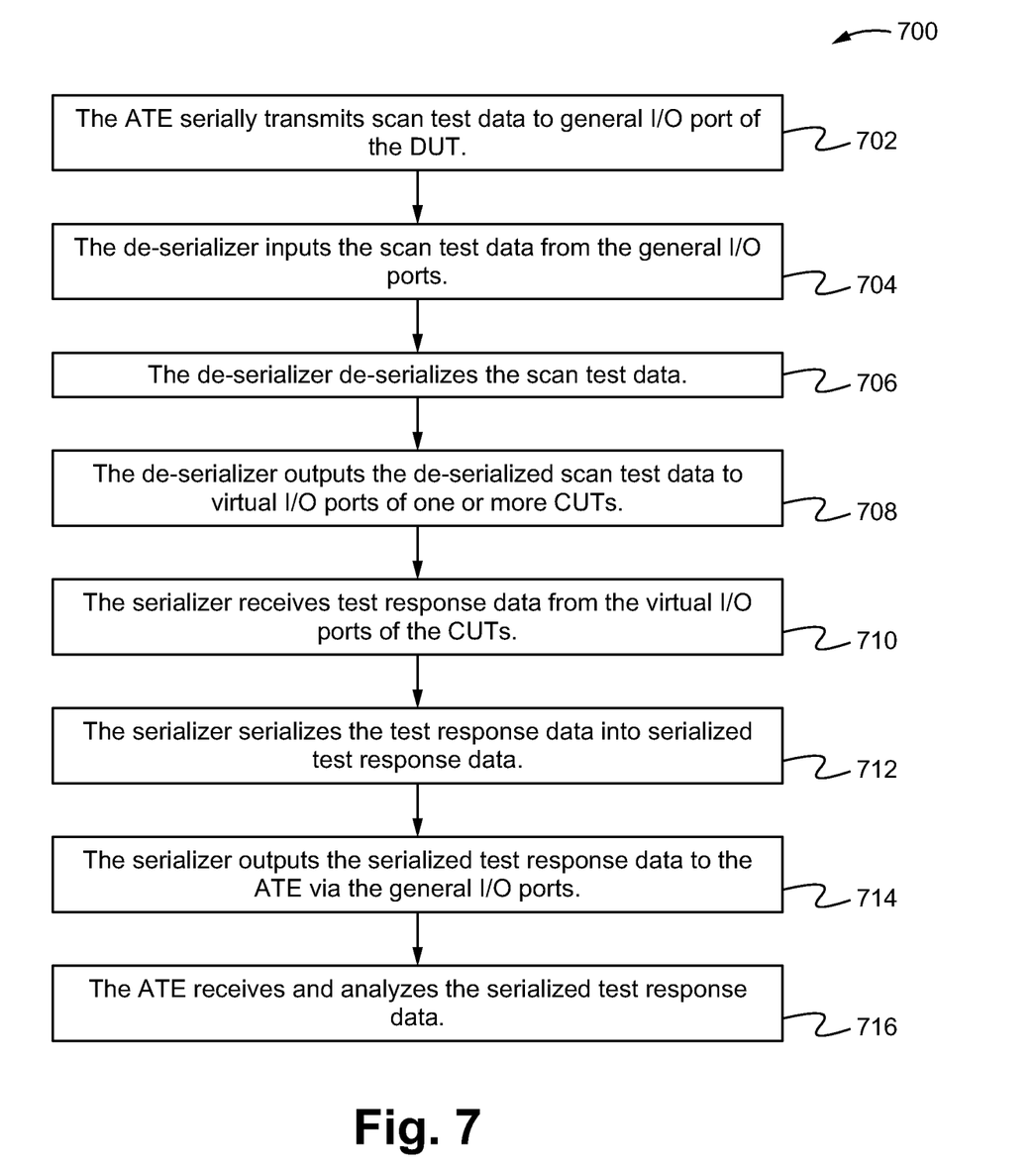
FIG. 7 illustrates a method of operating the integrated circuit verification system according to some embodiments.

FIG. 7 illustrates a method of operating the integrated circuit verification system 100 according to some embodiments. As shown in FIG. 7, the ATE 104 serially transmits scan test data to general-purpose input/output (I/O) port 110 of the DUT 102 at the step 702. The de-serializer 112 inputs the scan test data from the general-purpose I/O ports 110 at the step 704. The de-serializer 112 de-serializes the scan test data at the step 706. The de-serializer 112 outputs the de-serialized scan test data to virtual I/O ports 116 of one or more CUTs 108 at the step 708. The serializer 114 receives test response data from the virtual I/O ports 116 of the CUTs 108 at the step 710. The serializer 114 serializes the test response data into serialized test response data at the step 712. The serializer 114 outputs the serialized test response data to the ATE 104 via the general-purpose I/O ports 110 at the step 714. The ATE 104 receives and analyzes the serialized test response data at the step 716. Thus, the method provides the benefit of reducing IC test time (and thereby test cost) by enabling serialization of data transfer between the ATE 104 and the DUT 102 without requiring the use of specialized high-speed I/O pins (e.g. USB, PCIE, SERDES pins) that would require the ATE 104 to run at very high speeds, and also without requiring the packetization of the data that is associated with these specialized I/O pins/ports/interfaces.

In some embodiments, the analyzing of the serial test response data is performed by comparing the serialized test response data to expected response data. In some embodiments, the de-serializer 112 serially inputs the scan test data according to the serial clock. In some embodiments, the de-serializer 112 holds the scan test data static within the shift registers 206 for at least a half cycle of the scan clock and/or outputs the de-serialized scan test data according to the scan clock. Alternatively, one or more of the above steps are able to be omitted, re-ordered and/or additional steps are able to be added.

Accordingly, the integrated circuit verification system 100 provides the advantage of reducing IC test time (and thereby test cost) by enabling serialization of data transfer between the ATE and the DUT without requiring the use of specialized I/O pins (e.g. USB, PCIE, SERDES pins) that would require the ATE 104 to run at very high speeds, and also without requiring the packetization of the data that is associated with these specialized I/O pins. Further, because the system only needs to be stored on the DUT itself and does not require use of specialized I/O pins (and their associated protocols), the system provides the advantage of being ATE platform agnostic such that it can be used with any ATE without modification thereof. Additionally, because the internal logic runs on a much lower scan shift speed as opposed to the chip I/O pin, it is possible to close shift timing at lower shift frequency which often will require fewer logical components. Thus, the lower internal scan shift speed as well as the fewer needed logical components of the system provides the benefit of lower operational power of the IC during scan testing, and even during functional operation. Moreover, because it does not require the use of specific packetization protocols or ATE/DUT hardware, the system is able to be used seamlessly with the widely used scan compression techniques, including the sequential compression techniques. As a result, it is able to take full advantage of already existing test time reduction techniques widely in use. In other words, because the system does not require complex packetization of the scan data, standard ATPG tools can be used to generate patterns for ICs with this solution implemented and thus no specialized test equipment is required, and no modification or augmentation is necessary to test an IC that has this system deployed. In contrast to the other existing solutions, this system simply enables the ATE to drive the IC at maximum pad or ATE allowable frequency while internally it de-serializes the scan data to lower speed. Similarly on the output path, the system simply takes data from multiple internal virtual I/Os and serializes the data to the higher-speed data-rate supported by the ATE or chip I/O. Accordingly, the integrated circuit verification system, method and device have the benefit of being scalable across ICs, across technology nodes, as well as across automatic test equipment (ATE) platforms.

While the system, method and device has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details. In particular, it should be noted that although for the sake of clarity the system is described with a particular set of negative or positive sensitive elements (e.g. flip-flops, latches, data buses or other elements), the selected sensitivity of these elements is able to be switched (as long as their sensitivity relative to each other remains the same). Additionally, although the scan serializer 106 is described as a 4 to 1 serializer/de-serializer, higher or lower serialization/de-serialization ratios (and the corresponding ration between clock frequencies) are able to be used. In such embodiments, the number of lines inputting/outputting the non-serialized data, the number of flip-flops, latches and multiplexers coupled with the non-serialized data and/or the number of registers in each shift register is able to correspond to the higher or lower ratio. For example, whereas 4 of those elements are used for a 4 to 1 ratio, 8 of each of the elements are able to be used for an 8 to 1 ratio and so on for any other ratio.

We claim:

1. An integrated circuit verification system, the system comprising:
   an electronic device under test comprising:
      one or more general-purpose input/output (I/O) ports;
      a scan serializer including a serializer and a de-serializer, wherein an input of the de-serializer is coupled with the general-purpose I/O ports for serially receiving scan test data and an output of the serializer is coupled with the general-purpose I/O ports for serially outputting test response data; and
      one or more circuits under test having a plurality of virtual I/O ports, wherein an output of the de-serializer is coupled with the virtual I/O ports for transmitting de-serialized scan test data to the circuits under test and an input of the serializer is coupled with the plurality of virtual I/O ports for non-serially inputting the test response data from the circuits under test; and
   automatic test equipment having a memory and a processor and coupled with the device under test via the one or more general-purpose I/O ports, wherein the automatic test equipment is configured to generate the scan test for testing the device under test, serially transmit the scan test to the device under test via the one or more general-purpose I/O ports, serially receive the serial test response data via the one or more general-purpose I/O ports and analyze the serial test response data by comparing the serial test response data to expected response data stored on the memory.

2. The system of claim 1, wherein the general-purpose I/O ports do not require the serial scan test data to be formatted according to a packet protocol format.

3. The system of claim 1, wherein the scan serializer is a digital scan serializer such that the serializer is a digital serializer and the de-serializer is a digital de-serializer.

4. The system of claim 1, wherein the scan test data as serially transmitted by the automatic test equipment is not formatted into packets.

5. The system of claim 1, wherein the de-serializer comprises a plurality of shift registers each having a number of registers corresponding to a de-serialization ratio of the de-serializer.

6. The system of claim 5, wherein the de-serializer inputs the serial scan test data according to a serial clock, holds the serial scan test data static within the shift registers for at least a half cycle of the scan clock, and outputs the de-serialized scan test data according to a scan clock, wherein the scan clock is slower than the serial clock.

7. The system of claim 6, wherein negative edges of the scan clock and negative edges of the serial clock are aligned.

8. The system of claim 1, wherein the scan serializer further comprises a bypass component.

9. The system of claim 1, wherein the virtual I/O ports are inputs to flip-flops of the circuits under test.

10. The system of claim 1, wherein the expected response data is based on the scan test data.

11. An electronic device under test for operating with automatic test equipment, the electronic device under test comprising:
   one or more general-purpose input/output (I/O) ports for receiving scan test data serially transmitted from the automatic test equipment;

a scan serializer including a serializer and a de-serializer, wherein an input of the de-serializer is coupled with the general-purpose I/O ports for serially receiving the scan test data and an output of the serializer is coupled with the general-purpose I/O ports for serially outputting test response data to the automatic test equipment; and one or more circuits under test having a plurality of virtual I/O ports, wherein an output of the de-serializer is coupled with the virtual I/O ports for transmitting de-serialized scan test data to the circuits under test and an input of the serializer is coupled with the plurality of virtual I/O ports for non-serially inputting the test response data from the circuits under test.

12. The device of claim 11, wherein the general-purpose I/O ports do not require the serial scan test data to be formatted according to a packet protocol format.

13. The device of claim 11, wherein the scan serializer is a digital scan serializer such that the serializer is a digital serializer and the de-serializer is a digital de-serializer.

14. The device of claim 11, wherein the scan test data as serially transmitted by the automatic test equipment is not formatted into packets.

15. The device of claim 11, wherein the de-serializer comprises a plurality of shift registers each having a number of registers corresponding to a de-serialization ratio of the de-serializer.

16. The device of claim 15, wherein the de-serializer inputs the serial scan test data according to a serial clock, holds the serial scan test data static within the shift registers for at least a half cycle of the scan clock, and outputs the de-serialized scan test data according to a scan clock, wherein the scan clock is slower than the serial clock.

17. The device of claim 16, wherein negative edges of the scan clock and negative edges of the serial clock are aligned.

18. The device of claim 11, wherein the scan serializer further comprises a bypass component.

19. The device of claim 11, wherein the virtual I/O ports are inputs to flip-flops of the circuits under test.

20. The device of claim 11, wherein the expected response data is based on the scan test data.

21. A method of operating an integrated circuit verification system, the method comprising:

serially transmitting scan test data with automatic test equipment to one or more general-purpose input/output (I/O) ports of an electronic device under test, the electronic device under test including a scan serializer including a serializer and a de-serializer;

serially inputting the scan test data from the general-purpose I/O ports with the de-serializer, de-serializing the scan test data into de-serialized scan test data, and outputting the de-serialized scan test data to a plurality of virtual I/O ports of one or more circuits under test;

non-serially receiving test response data from the virtual I/O ports of the circuits under test with the serializer, serializing the test response data into serialized test response data, and outputting the serialized test response data to the automatic test equipment via the general-purpose I/O ports; and serially receiving and analyzing the serialized test response data with the automatic test equipment by comparing the serialized test response data to expected response data.

22. The method of claim 21, wherein the general-purpose I/O ports do not require the serial scan test data to be formatted according to a packet protocol format.

23. The method of claim 21, wherein the scan serializer is a digital scan serializer such that the serializer is a digital serializer and the de-serializer is a digital de-serializer.

24. The method of claim 21, wherein the scan test data as serially transmitted by the automatic test equipment is not formatted into packets.

25. The method of claim 21, wherein the de-serializer comprises a plurality of shift registers each having a number of registers corresponding to a de-serialization ratio of the de-serializer.

26. The method of claim 25, wherein the de-serializer serially inputs the scan test data according to a serial clock, further comprising holding the scan test data static within the shift registers for at least a half cycle of the scan clock, and outputting the de-serialized scan test data according to a scan clock, wherein the scan clock is slower than the serial clock.

27. The method of claim 26, wherein negative edges of the scan clock and negative edges of the serial clock are aligned.

28. The method of claim 21, wherein the scan serializer further comprises a bypass component.

29. The method of claim 21, wherein the virtual I/O ports are inputs to flip-flops of the circuits under test.

30. The method of claim 21, wherein the expected response data is based on the scan test data.

* * * * *